(12) United States Patent
Sexton

(10) Patent No.: US 7,940,077 B2
(45) Date of Patent: May 10, 2011

(54) ADJUSTABLE RESISTANCE

(75) Inventor: Andrew Sexton, New City, NY (US)

(73) Assignee: LeCroy Corporation, Chestnut Ridge, NY (US)

( * ) Notice: Subject to any disclaimer, the term of this patent is extended or adjusted under 35 U.S.C. 154(b) by 322 days.

(21) Appl. No.: 11/641,984

(22) Filed: Dec. 19, 2006

(65) Prior Publication Data

US 2008/0055131 A1    Mar. 6, 2008

Related U.S. Application Data

(60) Provisional application No. 60/842,443, filed on Sep. 5, 2006.

(51) Int. Cl.
   *H03K 17/16* (2006.01)
(52) U.S. Cl. .......................................................... 326/30
(58) Field of Classification Search ...................... 326/30
   See application file for complete search history.

(56) References Cited

U.S. PATENT DOCUMENTS

| | | | |
|---|---|---|---|
| 5,422,608 A | 6/1995 | Levesque | |
| 5,559,448 A | 9/1996 | Koenig | |
| 5,955,911 A | 9/1999 | Drost et al. | |
| 6,055,269 A | 4/2000 | Drost et al. | |
| 6,157,215 A * | 12/2000 | Gabara et al. | 326/83 |
| 6,509,756 B1 * | 1/2003 | Yu et al. | 326/30 |
| 6,642,741 B2 * | 11/2003 | Metz et al. | 326/30 |
| 6,720,795 B2 | 4/2004 | Partow et al. | |
| 6,815,980 B2 | 11/2004 | Kerr | |
| 6,888,370 B1 | 5/2005 | Luo et al. | |
| 6,937,058 B2 | 8/2005 | Viehmann et al. | |
| 7,382,153 B2 * | 6/2008 | Ou-yang et al. | 326/30 |
| 7,423,450 B2 * | 9/2008 | Santurkar et al. | 326/30 |
| 2005/0225353 A1 | 10/2005 | Kwon | |
| 2006/0022701 A1 | 2/2006 | Tokuhiro et al. | |

* cited by examiner

*Primary Examiner* — Rexford N Barnie
*Assistant Examiner* — Thienvu V Tran
(74) *Attorney, Agent, or Firm* — Gordon Kessler

(57) ABSTRACT

In one implementation, a termination circuit may include a variable resistance circuit that comprises a resistance network in which the resistance of a parallel combination of two complementary transistors of opposite types is substantially independent of the drain-to-source voltages of the transistors when the gate-to-source voltages of the transistors are substantially equal in magnitude and opposite in sign. In various examples, the network may include a resistor in parallel and/or series with the transistors. Some implementations may adjust a resistance of the network in response to a digital-to-analog converter output signal. In another implementation, an integrated circuit may include a termination stage with an integrated resistor in parallel or series with a circuit having a tunable impedance. In an illustrative embodiment, relative channel width of the first and second transistors may be selected to realize substantially complementary characteristics for drain-to-source voltage vs. drain-to-source resistance.

4 Claims, 5 Drawing Sheets

ADJUSTABLE RESISTANCE

CROSS-REFERENCE TO RELATED APPLICATIONS

This application claims priority to U.S. Provisional Application Ser. No. 60/842,443, entitled "Adjustable Resistance" by A. Sexton, filed Sep. 5, 2006, which is incorporated herein by reference.

TECHNICAL FIELD

Various embodiments relate to providing a controllable resistance.

BACKGROUND

Data rates continue to increase in digital systems, communication systems, computer systems, and in other applications. In such applications, various devices communicate data using signals that may be encoded with information in the form of signal levels (e.g., amplitude) in certain intervals of time. Proper decoding of signals, for example, may involve measuring small signal levels in the correct time intervals. As data rates increase, margins of error for the signal level timing tend to decrease.

Likewise, operating frequencies for some analog signal processing systems continue to increase along with advances in telecommunication technologies, for example.

In general, some signals may propagate along a signal path from a transmitter to a receiver. For example, a signal may propagate through a transmission line, such as a coaxial cable, printed circuit trace, or twisted pair, for example. In some applications, transmission lines may provide a relatively constant characteristic impedance. Similarly, signal paths in the source and the receiver may have impedances that differ from the transmission line impedance.

For high frequency signals, impedance discontinuities may result in signal reflections. In some cases, signal reflections can result in significant signal loss and/or distortion.

SUMMARY

In one implementation, a termination circuit may include a variable resistance circuit that comprises a resistance network in which the resistance of a parallel combination of two complementary transistors of opposite types is substantially independent of the drain-to-source voltages of the transistors when the gate-to-source voltages of the transistors are substantially equal in magnitude and opposite in sign. In various examples, the network may include a resistor in parallel and/or series with the transistors. Some implementations may adjust a resistance of the network in response to a digital-to-analog converter output signal. In another implementation, an integrated circuit may include a termination stage with an integrated resistor in parallel or series with a circuit having a tunable impedance. In an illustrative embodiment, relative channel width of the first and second transistors may be selected to realize substantially complementary characteristics for drain-to-source voltage vs. drain-to-source resistance.

Some embodiments may have one or more of the following advantages. For example, an effective bandwidth for a termination stage may be increased by reducing and/or eliminating discrete (e.g., surface mount) resistive elements. Such component reduction may yield reductions in product size, manufacturing cost, and/or assembly cost. Signal fidelity may be improved integrating various embodiments in a semiconductor device to provide accurate termination in close proximity to the receiver. Some embodiments may be integrated on the same substrate or in the same package as upstream and/or downstream signal conditioning and/or signal processing circuitry. Various advantages may be achieved without external devices, such as reference resistors. In various applications, resistance values may be user and/or software selectable, and may furthermore allow, for example, in-situ self-tuning to substantially minimize reflections.

The details of one or more embodiments are set forth in the accompanying drawings and the description below. Other features, objects, and advantages will be apparent from the description and drawings, and from the claims.

DESCRIPTION OF DRAWINGS

Like reference symbols in the various drawings indicate like elements.

DETAILED DESCRIPTION OF ILLUSTRATIVE EXAMPLES

Figure 1:
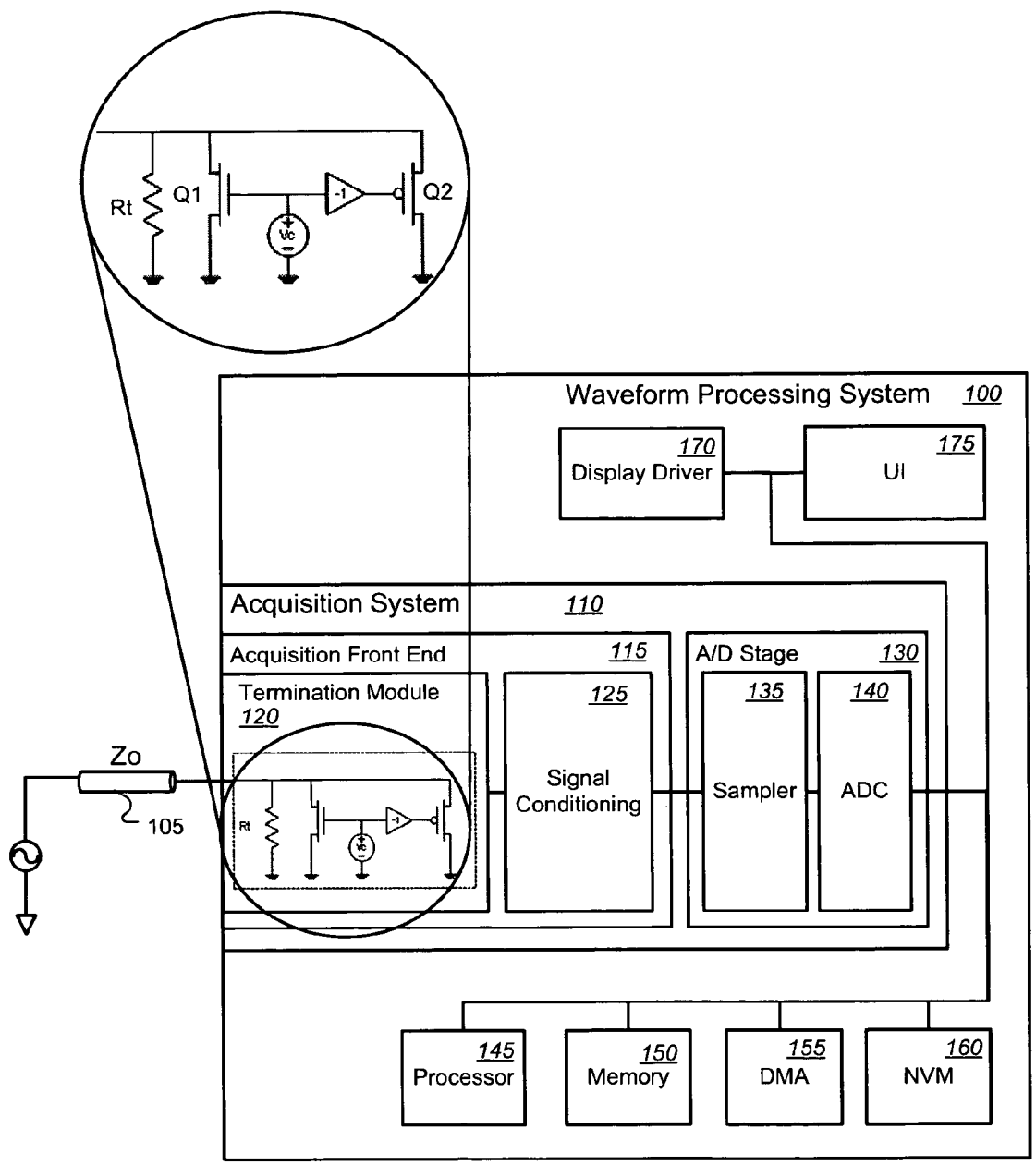
FIG. 1 shows a block diagram of an exemplary waveform processing system with an exemplary adjustable termination resistance.

FIG. 1 shows an exemplary waveform processing system 100 configured to receive and process electrical signals. In this example, the system 100 is configured to receive an electrical signal from a cable 105. The waveform processing system 100 includes an acquisition system 110 to receive, process, and output a digital representation of the electrical signal. The acquisition system 110 includes an acquisition front end 115, which has a termination module 120 to substantially match the impedance of the cable (Zo), and a signal conditioning module 125 to condition the acquired signal. The acquisition system 110 further includes an analog-to-digital (A/D) stage 130 to convert the signal to a digital representation. In the depicted example, the termination module 120 includes a resistor Rt connected in parallel with two transistors Q1, Q2 to terminate the input. The transistors Q1, Q2 are N-channel and P-channel field effect transistors, respectively. For purposes of description, Q1, Q2 are described as being connected in parallel such that their respective drains are connected to one node and their respective sources are connected to a second node. However, such configuration is for illustration and not meant to be limiting. One of ordinary skill in the art will recognize that device symmetry in the various embodiments described herein may permit the transistors to be operatively connected such that the drain and the source of Q1 are connected, respectively, to the source and the drain of Q2. According to the parallel connection example, the gate-to-source voltages (Vgs) of Q1 and Q2 are substantially equal in magnitude but opposite in sign. In response to a control signal (Vc), the Vgs of each of the transistors Q1, Q2 may be adjusted to provide a range of resistance values for the termination module 120. The transistors Q1, Q2 are arranged to have substantially complementary characteristics such that, for a selected control voltage Vc, the resistance of their parallel combination remains substantially constant over a range of input signal voltages.

Impedance discontinuities may be present, for example, due to differences in characteristic impedance (Zo) of the cable 105 and an impedance at an input the termination module 120. Parameters such as signal loss, effective bandwidth, and/or timing accuracy (e.g., phase), for example, may each be negatively impacted by such impedance mismatches.

In the depicted example, a resistance of the termination module 120 may be controlled (e.g., by a tuning signal) to provide a resistance that substantially matches Zo. As such, the termination module provides a mechanism to mitigate loss of signal integrity associated with mismatched impedance between the cable 105 and the termination module 120.

For example, the termination module 120 may require an accurate termination resistance (e.g., with error within 0.1%, 0.5%, 1%, or 5%) to effectively mitigate reflections and other signal distortions. In some implementations, reducing reflections may, for example, reduce errors in frequency response and/or gain errors. In the depicted example, the termination resistance may be related to an equivalent resistance of a resistive network including Rt, Q1, and Q2. In some embodiments, by varying Vgs applied to each of Q1 and Q2 in response to the control signal, the equivalent resistance of the resistive network may be adjusted to match Zo.

In the depicted example, Q1 is an n-channel field effect transistor (NFET) and Q2 is a p-channel field effect transistor (PFET). Q1 and Q2 are connected in parallel to form an adjustable resistive network. As shown, the drain terminals of Q1 and Q2 are connected, and the source terminals of Q1 and Q2 are connected. In response to the control signal, the termination module 120 may generate a Vgs for Q1 ($Vgs_N$) and a Vgs for Q2 ($Vgs_P$) such that $Vgs_N$ is approximately equal to $-Vgs_P$. In some examples, the combination of Q1 and Q2 may be configured to have complementary resistance characteristics over a range of input voltages. Exemplary resistance characteristics for Q1 and Q2 are described in further detail with reference to FIG. 2.

In the embodiment of FIG. 1, the termination module 120 further includes a non-controlled resistance, resistor Rt, connected in parallel with the two transistors Q1, Q2. In other embodiments, one or more non-controlled resistances may be connected in parallel, series, or in a combination thereof, with the transistors Q1, Q2. In some embodiment, the resistor Rt may be formed, for example, as an integrated resistor in the IC to reduce the size of the acquisition front end 115. In other examples, the resistor Rt may be a combination of discrete components and/or integrated resistors. Various embodiments may implement non-controlled resistances using one or more techniques and/or apparatus that may include, but are not limited to, resistive (e.g., nichrome) wire, laser trimming, discrete (e.g., surface mount, leaded) resistors, screen printed resistors, and resistive inks.

The acquisition front end 115 also includes a signal conditioning module 125 that may condition at least one input signal using one or more operations. Signal conditioning operations may include, but are not necessarily limited to, operations to amplify, offset, filter, attenuate (e.g., limit), phase shift, delay, convert from single-ended to differential, convert from differential to single-ended, or a combination of these and/or other signal conditioning operations.

In some embodiments, the acquisition front end 115 may be implemented, in part or substantially entirely, in at least one integrated circuit (IC), hybrid module, or other integrated package that contains some or all of the termination module 120 and/or the signal conditioning module 125.

The analog to digital (A/D) stage 130 in the acquisition system 110 includes a sampler 135 and an analog to digital converter (ADC) 140. In one example, the sampler 135 tracks a voltage of the signal in one state and holds the tracked voltage in another state. The ADC 140 reads the voltage signal held in the sampler 135, and generates a digital representation of the amplitude of the held voltage signal. The digital representation may include a digitally-encoded value that can be digitally processed and/or stored. In some examples, the sampler circuit 130 and the ADC 135 cooperate to digitize an input signal waveform by sampling and converting the amplitude of an input signal to a digital representation at each of a predetermined number of sample times. In some embodiments, the circuit of the termination module 120 may be implemented at other points in the signal path. For example, the circuit of the termination module 120 may be incorporated at an input of the A/D stage 130, such as at the input of a track-and-hold circuit in the sampler 135.

The digital representation values that are output by the A/D stage 130 may be transmitted to various processing and storage components of the waveform processing system 100 via a digital (e.g., serial or parallel) bus, for example. The digital representation values may be stored, for example, in a cache, buffer, volatile or non-volatile memory location, or other data store. The data may be sent for display on a display device, or transmitted over a wired or wireless communication link, for example.

The waveform processing system 100 of this example also includes a processor 145 to perform various processing functions, such as supervisory, user interface, signal processing, and signal analysis, in support of the operations of the system 100. For example, the processor 145 may perform operations that include signal processing, digital filtering (e.g., IIR, FIR) and/or numerical operations (e.g., curve fitting, numerical derivative computation, numerical integration, fast Fourier transformation (FFT), and interpolation). Additionally, the processor 145 may supervise various operations, such as waveform data collection and user interaction. The processor 145 may include one or more of the following: an ASIC (application specific integrated circuit), DSP (digital signal processor), discrete or integrated analog and/or digital circuits, for example.

In the depicted example, the processor 145 is coupled through the digital bus to memory devices, including a memory 150, a Direct Memory Access (DMA) controller 155, and a non-volatile memory (NVM) 160. The NVM 160 may provide a storage space for storing data (e.g., sampled waveform data acquired by the acquisition system 110) and/or executable instructions (e.g., application software). The NVM 160 may include, for example, flash memory, read only memory (ROM), EEPROM, data storage devices with rotating media (e.g., optical or magnetic disc drive), tape storage devices, or any combination of such devices. The memory 150 may provide temporary storage for the sampled signal data from the acquisition system 110. The memory 150 may include volatile data storage, for example, in one or more RAM, buffers, and/or cache memories. The DMA 155 may handle accesses of the memory 150 without direct involvement of the processor 145. For example, the DMA 155 may move data from one memory location to another memory location. In another example, the DMA 155 may be configured to move samples of the input signal from the acquisition system 110 directly into sequential memory locations, such as an array in the memory 150 and/or the NVM 160, for subsequent signal analysis.

In some embodiments, the processor 145 may execute instructions and retrieve information stored in the NVM 160 via the digital bus. The NVM 160 may include a number of code modules (not shown) to perform measurement operations and maintenance operations.

For example, the NVM 160 may include one or more software modules to adjust the resistance of the termination module 120 to reduce signal distortion of the acquired waveform.

In some embodiments, the processor 145 may execute operations to adjust the resistance of the termination module 120 during a calibration process. For example, the calibration process may include operations to improve signal quality of the received waveform by calibrating the resistance of the termination module 120 and the cable 105. For example, such a calibration process may include generating test signals, acquiring the test signals, measuring reflections in the measured signal, and determine a required adjustment to the control voltage Vc to achieve a desired resistance of the termination module 120.

The waveform processing system 100 includes a display driver 170 to format and send images for display on a display device (not shown). For example, the waveform processing system 100 may display calibration results on the display device using the display driver 170. In some implementations, a user may use the display driver 170 and a user interface (UI) 175 to initiate and control the calibration process. The UI 175 may include one or more input devices (e.g., keyboard, keypad, soft menus, dials, buttons, touch screen, mouse, etc.) and one or more output devices (e.g., display screen, printer port, audio outputs, indicator lights, etc.). Using the display driver 170 and the UI 175, the user can specify calibration parameters, such as an error tolerance of the calibration process. Calibration data may be stored along with associated information, such as temperature coefficient data for compensating the control voltage over a range of operating temperature, for example.

In an exemplary application, a specified resistance value may be entered into the UI 175, for example, based on a known impedance characteristic information of the cable 105 at one or more frequencies. In response, the system 100 may operate to adjust the resistance of the termination module 120 to the specified resistance value.

In another example, the UI 175 may receive user input (e.g., knob rotation, up/down arrow keys, numeric keypad, etc.) by which the user may directly set or command changes to resistance values based on observation of a digital representation of a calibration input signal (e.g., square wave input). In such examples, a user could manually control the increase or decrease of the resistance of the termination module 120 until the observed effects of signal reflections are minimized, for example.

As an illustrative example, after the calibration process is initiated, the processor 145 may measure the termination resistance using a self-generated signal. Next, the processor 145 may compare the measured resistance and a nominal termination resistance. If an error between the measured resistance and the nominal termination resistance is greater than a threshold tolerance, then the processor 145 may adjust the control signal to vary the termination resistance.

In an exemplary embodiments, the processor 145 may execute operations to adjust the termination resistance in the termination module 120 based on a temperature measurement near the termination module 120. If, for example, the resistance at a particular control voltage Vc has a substantial dependence on temperature, then the controller may execute instructions to compensate for this effect. In some embodiments, the processor may execute instructions to adjust the control voltage Vc to make the input resistance of the termination module 120 substantially independent of input voltage over a range of temperatures.

In some embodiments, the processor 145 may execute operations to adjust the termination resistance in the termination module 120 based on detected signal reflections introduced in the acquired waveform. For example, the processor 145 may execute a software module that monitors the signal quality at the termination module 120. When a detected signal reflection is greater than a predetermined threshold, the processor 145 may adjust the termination resistance to reduce signal reflections. In another embodiment, an embodied controller (not shown) in the acquisition system 110 may measure the level of signal reflection. The embodied controller may generate the control signal to adjust the termination resistance to reduce signal reflection.

In some embodiments, the control signal in the termination module 120 may be selected during a manufacturing process. During the manufacturing process, the control signal may be preset to, for example, a substantially constant voltage such that Q1 and Q2 provide a combined resistance to be substantially constant. For example, a manufacturer may measure the actual resistance in Rt. Based on the resistance of Rt, the manufacturer can determine the voltage level for the control signal to generate a predetermined overall termination resistance (e.g., 50 Ohm, 75 Ohm, 100 Ohm, etc.) using Q1 and Q2. As an illustrative example, suppose a required termination resistance is 50 Ohm and the resistance of Rt is 85 Ohm. In the depicted example, the required resistance of the parallel connected Q1 and Q2 may be approximately 121.5 Ohm, with a tolerance, for example, of up to about 1% or more. The manufacturer may select the control signal such that, in response to the control voltage, the combination of Q1 and Q2 may have a resistance of 121.5 Ohm over a range of input voltage.

By selecting an appropriate control signal, Q1 and Q2 may respond such that the termination resistance may be independent of the input signal amplitude. In one example, the combined resistance of Q1 and Q2 may be a substantially constant when the input signal varies over a range of input voltage. An example of the response of the combined resistance of Q1 and Q2 is described with reference to FIG. 2.

Figure 2:
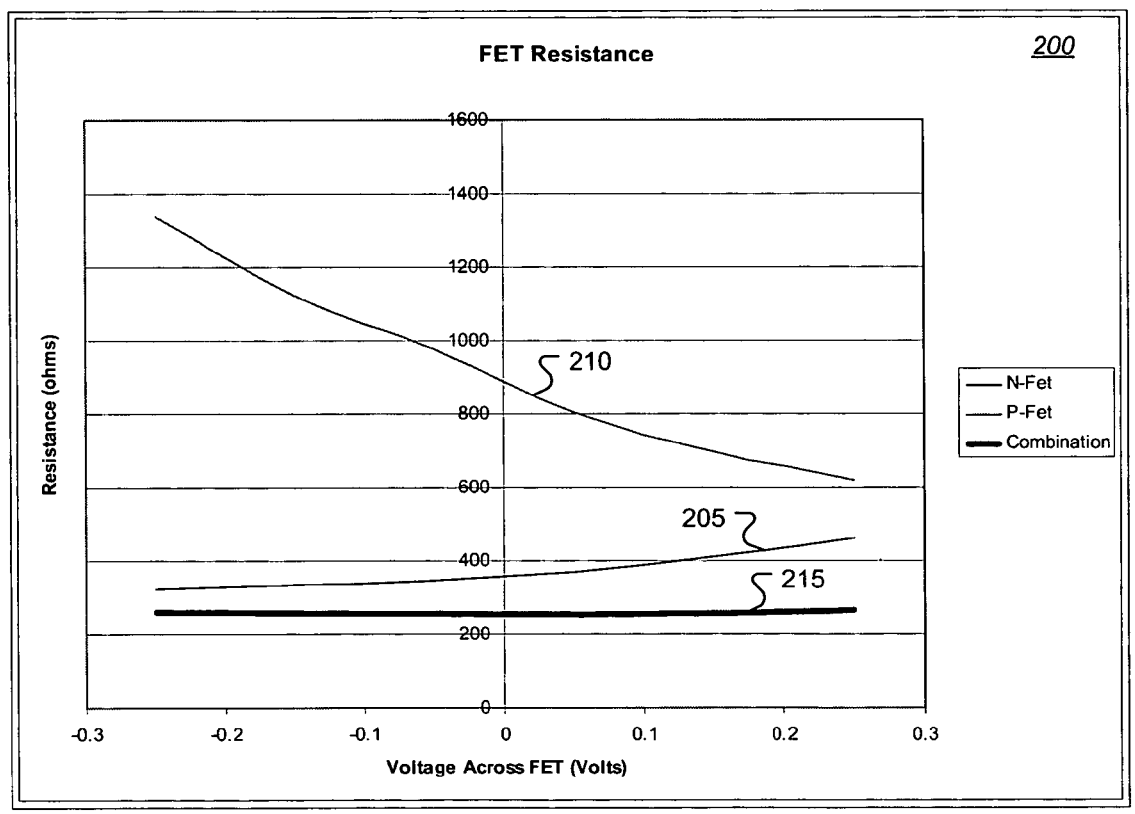
FIG. 2 shows an exemplary resistance characteristic for a termination module over a range of input voltages.

FIG. 2 shows an exemplary graph 200 that includes resistance characteristics curves for a complementary pair of parallel connected NFET and PFET transistors. One example of such complementary pair is described with reference to the termination module 120 (FIG. 1).

As shown in the curves 205, 210, the resistance characteristics of the PFET and the NFET vary over a range of Vds. For example, the resistance of the NFET increases when Vds increases, and the resistance of the PFET decreases as Vds increases. A curve 215 shows the combined resistance of the PFET and the NFET for the input voltages. As shown, the resistance characteristics of the PFET and the NFET are substantially complementary such that the combined resistance of the parallel connected PFET and NFET is substantially constant over a range of voltage across the transistors.

The NFET and the PFET may be selected to have substantially complementary characteristics using a standard process. In some embodiments, the resistance characteristics of the PFET and the NFET may be based on, for example, a width and a length of each of the transistors. In some implementations, a ratio (e.g., 3:7, 1:4) of standard PFET and NFET may be selected from a standard transistor library to obtain a substantially complementary resistance characteristics as shown in the graph 200.

In some embodiments, the resistance characteristics of NFET and PFET may depend on Vgs of each of the NFET and PFET. In some embodiments, the NFET and PFET are connected such that the drain terminals of the NFET and PFET are coupled and the source terminals of the NFET and PFET are coupled. In some other embodiments, the NFET and PFET are connected such that the drain terminal of the NFET and the source terminal of the PFET are coupled, and the source terminal of the NFET and the drain terminal of the PFET are coupled. Additionally, the NFET and the PFET may be configured to receive Vgs such that $V_{gsN}$ and $-V_{gsP}$ are approximately equal. The parallel configuration of the NFET and PFET may generate a substantially constant combined resistance over a range of Vds across the NFET and the PFET.

Figure 3A:
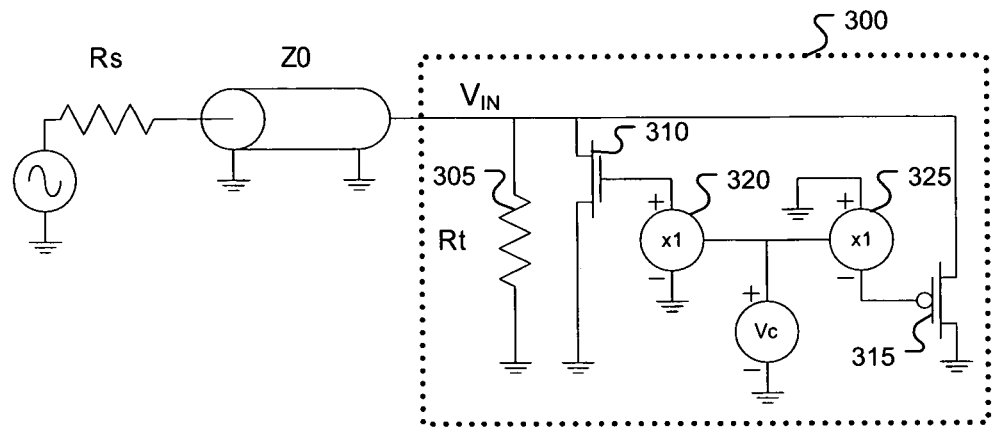
FIGS. 3A-3B show schematics of exemplary termination circuits with adjustable resistance.
Figure 3B:
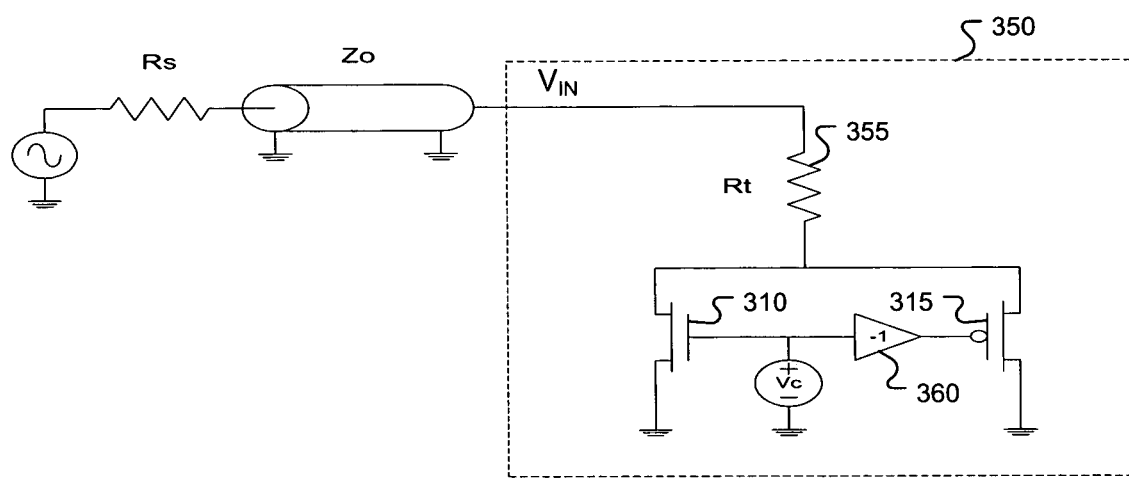

FIGS. 3A-3B show exemplary embodiments that may be used, for example, in the termination module 120. In particular, two control architectures are shown, as are two embodiments for implementing an uncontrolled resistance. Each of the depicted examples includes two transistors connected in parallel such that their respective drain terminals are connected and their respective source terminals are connected. In response to a control signal, gate-to-source signals are generated that are substantially equal in magnitude but opposite in sign. The configuration of the two transistors may generate a substantially constant resistance over a range of Vds, such as the combined resistance as shown in the curve 215. Optionally, the two transistors may be connected in parallel such that drain terminals are connected to the source terminals, respectively.

As shown in FIG. 3A, a resistance module 300 includes a resistor 305 connected in parallel with a NFET transistor 310 and a PFET transistor 315. In various embodiments, the NFET transistor 310 and the PFET transistor 315 may be connected in parallel, and may be connected in parallel and/or series with one or more uncontrolled resistors. In the depicted example, an input voltage ($V_{IN}$) is applied directly as a drain-to-source voltage across the transistors 310, 315. A resistance of the resistance module 300 is considered in this example to refer to an effective resistance between $V_{IN}$ and circuit ground. Over a range input voltage $V_{IN}$, the drain-to-source resistances of each of the transistors 310, 315 vary in a substantially complementary manner such that the parallel combination of the transistors 310, 315, and thus the resistance of the resistance module 300, has an effective combined resistance that is substantially constant within a range of input voltage $V_{IN}$.

The resistance module 300 also includes two control circuits 320, 325. The gate control circuits 320, 325 receive a control voltage Vc and generate gate voltages for the transistor 310, 315, respectively. In some embodiments, the control voltage Vc may be a fixed voltage that is preset during calibration in, for example, a manufacturing process. In other embodiments, Vc may be a dynamically controllable voltage that is responsive, for example, to a signal generated by a microprocessor. With reference to FIG. 1, for example, the control voltage Vc may be generated when the processor 145 executes the calibration process to reduce reflections at the termination module 120. Using a digital to analog converter (DAC), the control voltage can be generated from the output of a digital circuit.

In response to the control voltage, the gate control circuits 320, 325 may generate gate-to-source voltages (Vgs) for each of the transistors 310, 315. The control circuits 320, 325 may generate Vgs such that Vgs of the NFET 310 and the PFET 315 are equal in magnitude and opposite in sign.

Various implementations may be used to implement the control circuits 320, 325. In some implementations, the control circuits 320, 325 may be implemented using operational-amplifier (op-amp) circuits. For example, each of the control circuits 320, 325 may each be implemented using an op-amp circuit with a unity gain such that, for example, the control circuit 320 may generate a voltage substantially equal to the control voltage, and the control circuit 325 may invert the polarity of the control voltage (e.g., using an inverting amplifier configuration). Some examples of the control circuits 320, 325 are described with reference to FIG. 4.

As shown in FIG. 3B, an exemplary resistance module 350 includes a resistor 355 connected in series with the NFET 310 and the PFET 315. The NFET 310 and PFET 315 may be connected in parallel, as has been described. By varying Vgs of the transistors 310, 315, the resistance of the resistance module 350 may be adjusted. In some examples, the resistance of the resistance module 350 may be adjusted to substantially match the characteristic impedance of a transmission line (e.g., the cable 105).

The resistance module 350 includes a single inverter circuit 360 that receives the control voltage Vc. The inverter circuit 360 may convert a positive voltage to a negative voltage, or a negative voltage to a positive voltage. In operation, Vc may be set by a controller (e.g., an embedded controller or the processor 145) to control the resistance characteristic of the resistance module 350. In the depicted example, the NFET 310 receives Vc and the PFET 315 receives −Vc, which is converted from Vc by the inverter circuit 360. For a substantially constant Vc, the parallel combination of the PFET 315 and the NFET 310 may provide a substantially constant resistance.

Figure 4:
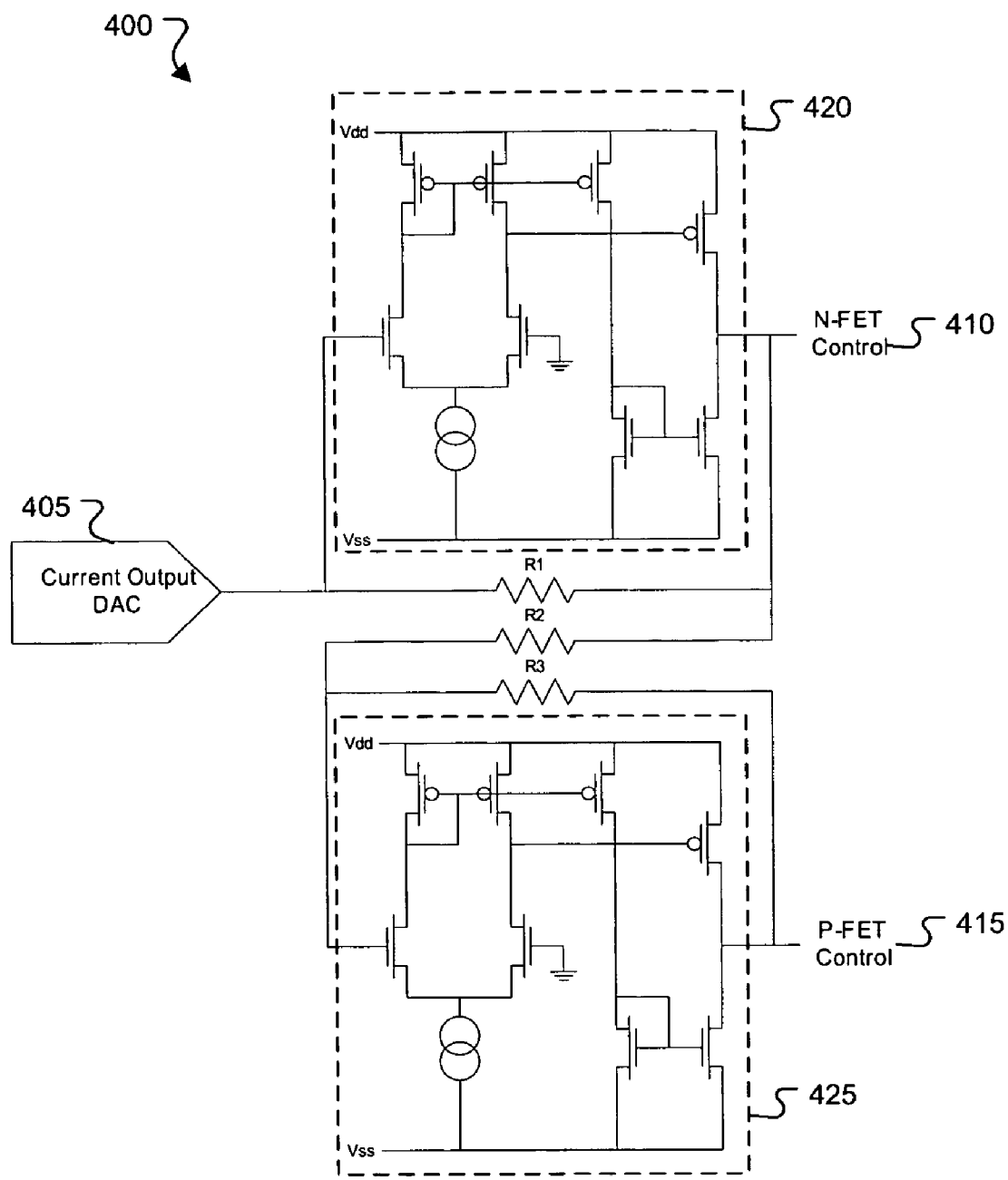
FIG. 4 illustrates an exemplary controller circuit to generate control signals.

FIG. 4 shows an exemplary implementation of a control circuit 400 that can generate gate-to-source voltages for the NFET 310 and the PFET 315 in the resistance modules 300, 350. The control circuit 400 receives an analog input signal from a source 405 and generates output voltages at outputs 410, 415. The outputs 410, 415 are coupled to the gate terminals of the transistors 310, 315, respectively. By controlling the output voltages at the outputs 410, 415, the resistance characteristics of the transistors 310, 315 may be controlled. In some implementations, the resistance characteristics of the transistors 310, 315 may be substantially complementary over a range of voltages when control voltages at the outputs 410, 415 are substantially equal in magnitude and opposite in sign.

In the depicted example, the source 405 provides an input as a current output from a DAC. In other examples, the analog input may be a variable current source controlled by an embedded controller or a microprocessor. For example, the controller or the microprocessor may execute operations to reduce reflections in the acquired signal by adjusting the resistance of the NFET 310 and the PFET 315. In some examples, the microprocessor may generate a digital output, which can be converted to the analog input by the DAC. Responsive to the analog input, the control circuit 400 can provide the required resistance for the transistors 310, 315 by generating the appropriate gate voltages at nodes 410, 415, respectively.

In an illustrative example, the current output DAC 405 may output a current signal that is proportional to a digital control word received from a processor (e.g., microprocessor, microcontroller, digital signal processor, or the like). In some embodiments, the DAC 405 may source and/or sink current when coupled to a control circuit 420 and a control circuit 425. In the depicted example, the control circuit 420 includes a high gain op-amp configured as a transimpedance amplifier to provide a voltage at an output node 410. The voltage at the node 410 is then a function of the current flowing into the DAC and a resistance of a feedback resistor R1. The control circuit 425 includes an inverting amplifier to provide a voltage at an 4output node 415. The voltage at the node 415 is a function of the voltage at the node 410 multiplied by resistance R3/R2. If R3 is substantially equal to R2, then the voltages at the nodes 410, 415 may be substantially equal in magnitude and opposite in sign. In some embodiments, for example, the voltages at the nodes 410, 415 may be substantially equal in magnitude and opposite in sign with respect to a reference voltage, which may be a circuit reference (e.g., ground, 2.5V, VDD/2, etc . . . ) potential.

In some embodiments, the source 405 may also be a fixed current source that is manufactured to generate a pre-determined current for the control circuit 400. For example, the control circuit 400 may use the pre-determined current to generate gate voltages that adjust the NFET 310 and the PFET 315 to provide a required resistance (e.g., an appropriate termination resistance to terminate a transmission line).

In some implementations, the input to the control circuit 400 may be controlled by a user input. For example, a user of the waveform processing system 100 may use the UI 175 to select a termination resistance suitable for a present measurement (e.g., 50 Ohm, 75 Ohm, 100 Ohm). Based on the user selection, a multiplexer (MUX) may select an appropriate control signal to be transmitted to the control circuit 400. The control circuit 400 may then use the control signal to adjust the transistor resistances to provide the user selected resistance.

Figure 5A:
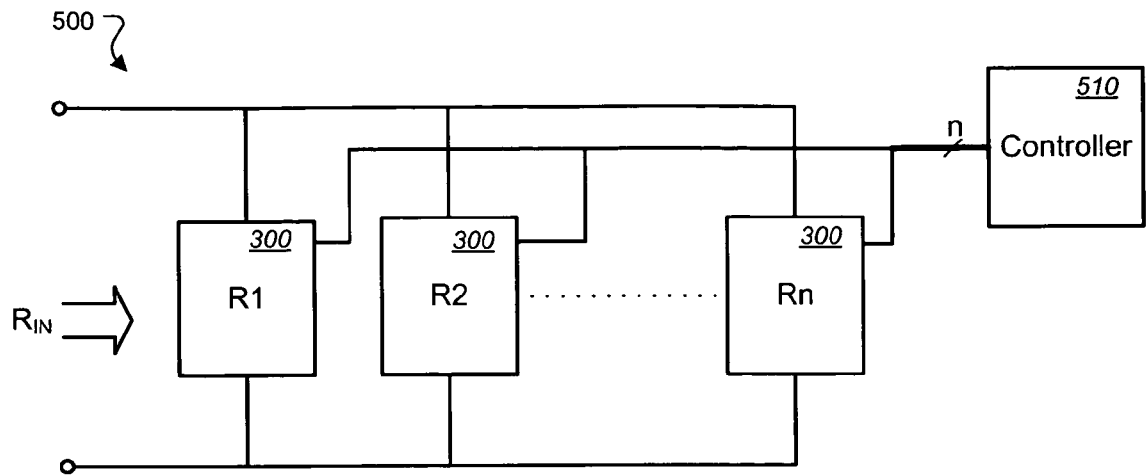
FIGS. 5A-5B illustrate exemplary controllable resistive networks.
Figure 5B:
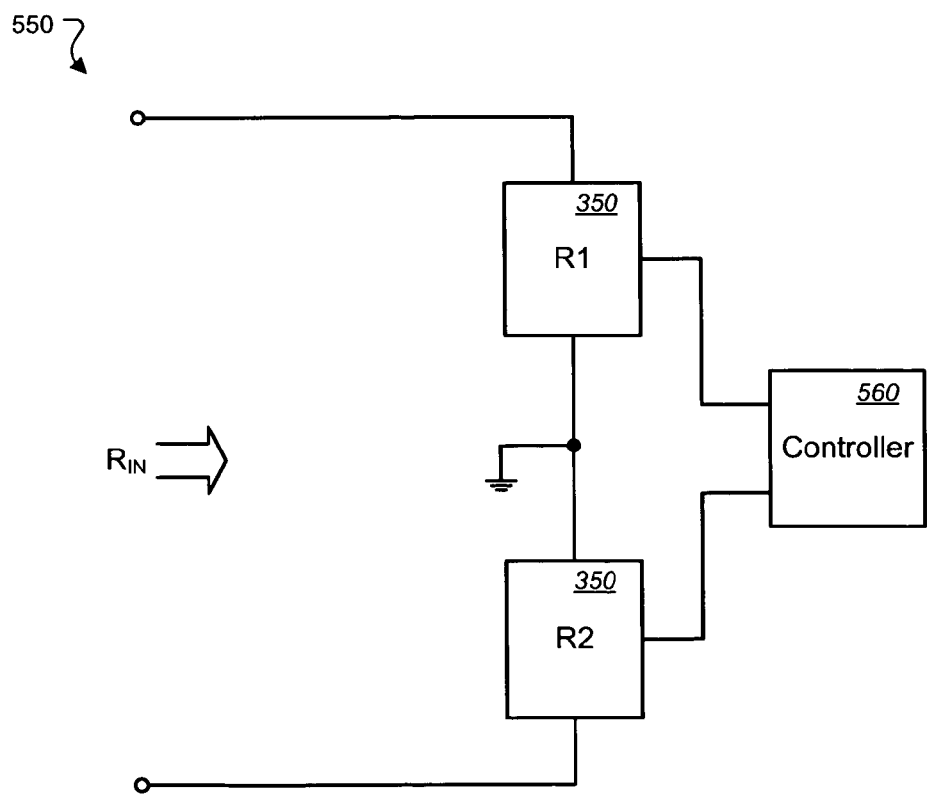

FIGS. 5A-5B show exemplary controllable resistive networks 500, 550, each of which includes one or more resistance modules (e.g., the resistance modules 300 or 350). In some examples, the controllable resistive networks 500, 550 may provide substantially constant resistance over a range of input voltage. In one example, the resistance of the controllable resistive networks 500, 550 may be adjusted in response to a control voltage signal (not shown).

As shown in FIG. 5A, the controllable resistive network 500 includes parallel connected resistance modules 300 to receive single-ended or differential signals. The controllable resistive network 500 includes a controller 510 that may control a resistance ($R_{IN}$) of the controllable resistive network 500.

In the depicted example, each resistance modules 300 receives a control signal from the controller 510. In some examples, the controller 510 may transmit independent control signals to each of the resistance modules 300. In some examples, the controller 510 may transmit substantially the same control signal to some or all of the resistance modules 300. Based on the received control signal, a resistance across each of the resistance modules 300 may be adjusted. For example, the controller 510 may use the control signal to set Vc in the resistance module 300. By adjusting Vc, the resistance of the resistance module 300 can be set as described with reference to FIG. 3A.

As shown in FIG. 5B, the controllable resistive network 550 includes two resistance modules 350 connected in series. In some examples, the controllable resistive network 550 may receive differential signals, such as low voltage differential signals (LVDS). The controllable resistive network 550 includes a controller 560 to control resistance characteristics of the resistance modules 350. In some embodiments, the controller 560 may set Vc in the resistance module 300 to control Vgs of the transistors 310, 315 (FIG. 3A) such that a resistance of the controllable resistive network 550 may be substantially constant over a range of input voltages.

Control signals to each of the modules R1, R2, . . . , Rn may be routed, for example, via a daisy chain, token ring, point-to-point, or other such arrangement. Data may be routed in parallel and/or serial format.

In some embodiments, the controllable resistive networks 500, 550 may be used as an on-chip termination resistor to terminate a transmission line. In some embodiments, the controllable resistive networks 500, 550 may be used to set, for example, a current level or a voltage reference level on an IC chip. In other embodiments, the controllable resistive networks 500, 550 may be used to implement a controllable voltage source or a controllable current source, in which a supplied voltage or current may be controlled by, for example, a microprocessor.

In the depicted examples, the controllable resistive networks 500, 550 include a plurality of the resistive modules 300 or the resistive modules 350. In some examples, each of the controllable resistive networks 500, 550 may include a combination of the resistance modules 300 and the resistance module 350. In some examples, the controllable resistive networks 500, 550 may also include other of resistance module embodiments.

A number of implementations have been described. Nevertheless, it will be understood that various modifications may be made.

For example, open or closed-loop control approaches may be used to generate the control voltage, Vc. For example, some embodiments may be controlled to provide a substantially linear potentiometer, for example, that is controlled to regulate another variable, such as a voltage, current, or temperature, for example. In some embodiments, the control voltage may be responsive to an error signal between a desired set-point or reference and a feedback value. Elements of such a control loop may include analog and/or digital components, programmed and/or programmable logic, processor, or controller circuits. Filter elements may relate to feedback loop dynamics and may include, but are not limited to, analog and/or digital filters, feed forward elements, and/or proportional, integral, and/or derivative feedback structures.

A termination stage may, for example, provide a dynamically controllable resistance for various applications. In some embodiments, an integrated resistor may provide a substantially fixed resistance with a large tolerance range. Tuning control signals output by an analog-to-digital converter, for example, may provide fine tuning adjustments by controlling the resistance of a parallel combination of N- and P-channel transistors. Such fine tuning control may be used where high speed signals come into or leave an integrated circuit. By way of example, but not limitation, the adjustable resistance of such networks may be used to dynamically control drive currents for ramp generators and/or current mirror circuits, voltage thresholds, and the like. In some embodiments, termination may be achieved where the signal is ac-coupled (e.g., through series capacitance).

Some embodiments may further integrate electromagnetic compatibility features in the same packages as the termination module 120. Some embodiments may include electrostatic protection diodes and/or transzorbs, which may be incorporated in integrated and/or discrete forms that improve, for example, high frequency performance.

In other embodiments, the need for a negative voltage supply or a negative gate voltage to the PFET may be avoided by connecting the source terminals of the transistors 310, 315 to a positive reference voltage (Vref). For example, the control circuits 320, 325 may generate the gate voltages to the transistors 310, 315 such that $Vgs_N=-Vgs_P$, where both of the gate voltages are substantially positive. Alternatively, a positive gate voltage may be avoided by connecting the source terminals of the transistors 310, 315 to a negative Vref.

In some embodiments, the gate control circuits (e.g., 320, 325, 360) may have gains other than unity. For example, the gate control circuits 320, 325 could amplify the control voltage Vc by a factor of 10, for example, to generate Vgs voltages of opposite sign but substantially equal magnitude. In some embodiments, gains for VgsN and VgsP need not be equal. This may allow the N and P devices to be the same size and still have complementary resistance curves.

In various implementations, the transistors may be of various types of devices, examples of which may include, but are not limited to, n- and p-channel junction field effect transistors (JFETs) or metal oxide semiconductor field effect transistors (MOSFETs), and NPN and PNP bipolar junction transistors (BJTs).

In various embodiments, advantageous results may be achieved if the steps of the disclosed techniques were performed in a different sequence, if components in the disclosed systems were combined in a different manner, or if the components were replaced or supplemented by other components. The functions and processes (including algorithms) may be performed in hardware, software, or a combination thereof, and some implementations may be performed on modules or hardware not identical to those described. Accordingly, other implementations are within the scope of the following claims.

What is claimed is:

1. A waveform processing apparatus comprising:
an integrated circuit that comprises:
a signal processing stage to process a signal within the integrated circuit; and
a termination stage to terminate the signal within the integrated circuit with a termination impedance, the termination stage comprising:
an integrated resistor having a first impedance;
a tuning circuit having a second impedance set in response to a tuning signal received by the tuning circuit, the tuning circuit being tunable without the use of a reference resistor,
wherein the termination impedance comprises an electrical combination of the first impedance and the second impedance;
wherein the tuning circuit comprises a first transistor and a second transistor having channels of opposite type material and being connected in parallel, wherein the resistance of the parallel transistors is substantially independent of voltage applied across the transistors when gate-to-source voltages of the transistors are substantially equal in magnitude and opposite in sign.

2. A method of processing signals in a waveform processor, the method comprising:
receiving an input signal at a node in an integrated circuit;
processing the input signal in a processing stage; and
terminating the input signal in the integrated circuit with a termination stage having a termination impedance that is substantially the electrical combination of a first impedance and a second impedance, the termination stage comprising:
an integrated resistor having the first impedance; and
a tuning circuit having the second impedance that is controllable in response to a tuning signal, the tuning circuit being tunable without the use of a reference resistor;
wherein the tuning circuit comprises a first transistor and a second transistor having channels of opposite type material and being connected in parallel, wherein the resistance of the parallel transistors is substantially independent of voltage applied across the transistors when gate-to-source voltages of the transistors are substantially equal in magnitude and opposite in sign.

3. A waveform processing apparatus comprising:
a first node to connect to a reference potential of a circuit;
a second node to connect to a signal path of the circuit; and
means for providing a current path between the first node and the second node, the current path having a resistance that is controllable over a range of resistance values, the resistance being controllable without the use of a reference resistor;
wherein the means for providing the current path comprises first and second transistors having channels of opposite type material and being connected in parallel, wherein the resistance of the parallel transistors is substantially independent of voltage applied across the transistors when gate-to-source voltages of the transistors are substantially equal in magnitude and opposite in sign.

4. The apparatus of claim 3, wherein at least one of the first or second transistors comprises two or more transistor devices.

* * * * *